(12) United States Patent
Koreeda (10) Patent No.: US 10,326,424 B2
(45) Date of Patent: Jun. 18, 2019

(54) FILTER DEVICE

(71) Applicant: Murata Manufacturing Co., Ltd., Nagaokakyo-shi, Kyoto-fu (JP)

(72) Inventor: Toshishige Koreeda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/963,574

(22) Filed: Apr. 26, 2018

(65) Prior Publication Data
US 2018/0248535 A1  Aug. 30, 2018

Related U.S. Application Data

(63) Continuation of application No. PCT/JP2016/070788, filed on Jul. 14, 2016.

(30) Foreign Application Priority Data

Nov. 27, 2015  (JP) .................................. 2015-232048

(51) Int. Cl.
H03H 9/00 (2006.01)
H03H 9/02 (2006.01)
(Continued)

(52) U.S. Cl.
CPC ...... *H03H 9/0028* (2013.01); *H03H 9/02992* (2013.01); *H03H 9/059* (2013.01);
(Continued)

(58) Field of Classification Search
CPC ............... H03H 9/0023; H03H 9/0028; H03H 9/02559; H03H 9/02992; H03H 9/0547;
(Continued)

(56) References Cited

U.S. PATENT DOCUMENTS

2008/0122554 A1* 5/2008 Harada ................ H03H 9/0561
333/25
2009/0153269 A1* 6/2009 Ono ..................... H03H 9/0085
333/193

(Continued)

FOREIGN PATENT DOCUMENTS

JP  2012-105097 A  5/2012
JP  2013-009411 A  1/2013
(Continued)

OTHER PUBLICATIONS

Official Communication issued in International Patent Application No. PCT/JP2016/070788, dated Oct. 4, 2016.

*Primary Examiner* — Barbara Summons
(74) *Attorney, Agent, or Firm* — Keating & Bennett, LLP (57) ABSTRACT

A filter device includes a filter chip on a multilayer substrate. The filter chip includes a reception filter chip portion and a transmission filter chip portion, and a reception filter defined by a first bandpass filter includes first and second balanced output terminals. First and second balance wirings connect first and second balanced input pads and first and second balanced output pads provided on a second principal surface of the multilayer substrate. The first and second balance wirings cross each other within the multilayer substrate and are electrically insulated from each other. A portion of a ground conductor is disposed at a region in which the first and second balance wirings overlap, interposed between portions of the first and second balance wirings, and disposed at a different substrate layer.

19 Claims, 7 Drawing Sheets

(51) Int. Cl.
  *H03H 9/05* (2006.01)
  *H03H 9/25* (2006.01)
  *H03H 9/64* (2006.01)
  *H03H 9/72* (2006.01)

(52) U.S. Cl.
  CPC ........ *H03H 9/0557* (2013.01); *H03H 9/0576* (2013.01); *H03H 9/25* (2013.01); *H03H 9/6483* (2013.01); *H03H 9/725* (2013.01); *H03H 9/02559* (2013.01)

(58) Field of Classification Search
  CPC .......................... H03H 9/0557; H03H 9/0561; H03H 9/0576; H03H 9/059; H03H 9/25; H03H 9/6433; H03H 9/6483; H03H 9/725; H03H 7/42; H03H 7/425; H03H 7/46; H03H 7/461; H03H 7/463
  USPC .......................................... 333/133, 193–196
  See application file for complete search history.

(56) References Cited

U.S. PATENT DOCUMENTS

| | | |
|---|---|---|
| 2010/0060372 A1 | 3/2010 | Funahashi et al. |
| 2011/0221542 A1 | 9/2011 | Kihara |
| 2012/0112854 A1 | 5/2012 | Iwaki et al. |
| 2013/0141180 A1* | 6/2013 | Uejima ................... H04B 1/48 333/4 |
| 2013/0214873 A1 | 8/2013 | Takamine |
| 2013/0314174 A1* | 11/2013 | Kato .................... H03H 9/0571 333/133 |

FOREIGN PATENT DOCUMENTS

| | | |
|---|---|---|
| WO | 2008/146552 A1 | 12/2008 |
| WO | 2010/067497 A1 | 6/2010 |
| WO | 2012/056767 A1 | 5/2012 |

* cited by examiner

FILTER DEVICE

CROSS REFERENCE TO RELATED APPLICATIONS

This application claims the benefit of priority to Japanese Patent Application No. 2015-232048 filed on Nov. 27, 2015 and is a Continuation Application of PCT Application No. PCT/JP2016/070788 filed on Jul. 14, 2016. The entire contents of each application are hereby incorporated herein by reference.

BACKGROUND OF THE INVENTION

1. Field of the Invention

The present invention relates to filter devices in which a bandpass filter chip is mounted on a multilayer substrate.

2. Description of the Related Art

For bandpass filters, it is desirable to have greater attenuation outside their passbands. International Publication No. WO2008/146552 discloses a filter device in which a reception side elastic wave filter chip and a transmission side elastic wave filter chip are mounted on a substrate. In International Publication No. WO2008/146552, at least one of the reception side elastic wave filter chip and the transmission side elastic wave filter chip is a balanced filter. In this balanced filter, first wiring connecting one of balanced terminals of the balanced filter and a first balance terminal formed on the substrate crosses second wiring connecting the other of the balanced terminals and a second balance terminal formed on the substrate in a state where the first wiring and the second wiring are electrically insulated from each other.

International Publication No. WO2008/146552 describes that the filter device has a greater out-of-band attenuation in the balanced filter and is able to improve isolation since the first wiring crosses the second wiring in a state in which the first wiring and the second wiring are insulated from each other.

However, even in the configuration described in International Publication No. WO2008/146552, the expansion of the out-of-band attenuation in the balanced filter is not enough.

SUMMARY OF THE INVENTION

Preferred embodiments of the present invention provide filter devices with an expanded out-of-band attenuation.

A filter device according to a preferred embodiment of the present invention includes a multilayer substrate including a plurality of substrate layers, a first principal surface, and a second principal surface facing the first principal surface; a first bandpass filter chip mounted on the first principal surface of the multilayer substrate and including a first balanced output terminal and a second balanced output terminal, the first bandpass filter chip defining a first balanced bandpass filter; a first balanced input pad and a second balanced input pad provided on the first principal surface of the multilayer substrate and connected to the first balanced output terminal and the second balanced output terminal of the first bandpass filter chip, respectively; a first balanced output pad and a second balanced output pad provided on the second principal surface of the multilayer substrate for external electrical connection; a first balance wiring provided inside the multilayer substrate and electrically connecting the first balanced input pad and the first balanced output pad; and a second balance wiring provided inside the multilayer substrate and electrically connecting the second balanced input pad and the second balanced output pad, wherein the first balance wiring and the second balance wiring cross each other within the multilayer substrate in a state in which the first balance wiring and the second balance wiring are electrically insulated from each other, and when the multilayer substrate is viewed from a first principal surface side, in plan view, a first ground pattern is included at a region in which the first balance wiring overlaps the second balance wiring, and the first ground pattern is interposed between a portion of the first balance wiring and a portion of the second balance wiring disposed in a different substrate layer.

In a filter device according to a preferred embodiment of the present invention, a second ground pattern is disposed between a portion of the first balance wiring and a portion of the second balance wiring, and the portion of the first balance wiring and the portion of the second balance wiring are provided next to each other within a same plane of the multilayer substrate. In this case, the out-of-band attenuation is further expanded.

In a filter device according to a preferred embodiment of the present invention, of the plurality of substrate layers of the multilayer substrate, the second ground pattern is provided on a substrate layer closest to the second principal surface. In this case, the out-of-band attenuation is further expanded.

In a filter device according to a preferred embodiment of the present invention, a plurality of via conductors are further included, wherein a plurality of ground terminals is provided on the second principal surface of the multilayer substrate, and the plurality of via conductors connect the plurality of ground terminals and the second ground pattern. In this case, the ground is reinforced, and the out-of-band attenuation is further increased.

In a filter device according to a preferred embodiment of the present invention, when the multilayer substrate is viewed from the first principal surface, in plan view, a spatial relationship between the first balanced input pad and the second balanced input pad is opposite to a spatial relationship between the first balanced output pad and the second balanced output pad. In this case, the out-of-band attenuation is further expanded while ensuring flexibility in wiring length design within a constrained space.

In a filter device according to a preferred embodiment of the present invention, a second bandpass filter chip mounted on the first principal surface of the multilayer substrate and defining a second bandpass filter is further included, thus defining a duplexer.

In a filter device according to a preferred embodiment of the present invention, the second bandpass filter chip is unified with the first bandpass filter. In this case, the number of components is reduced, and the size of filter device is reduced.

In a filter device according to a preferred embodiment of the present invention, at least one ground pattern is used in common at the first bandpass filter and the second bandpass filter. In this case, the ground is reinforced, and the out-of-band attenuation is further expanded.

In a filter device according to a preferred embodiment of the present invention, the first bandpass filter is a reception filter, and the second bandpass filter is a transmission filter.

In this case, the out-of-band attenuation of the reception filter is expanded, and isolation characteristics thereof is effectively improved.

With filter devices according to preferred embodiments of the present invention, the out-of-band attenuation is able to be further expanded.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention is disclosed in detail by describing specific preferred embodiments of the present invention with reference to the drawings.

It is noted that each preferred embodiment described in this specification is for illustrative purposes only, and elements of different preferred embodiments may be combined or partially exchanged.

Figure 1:
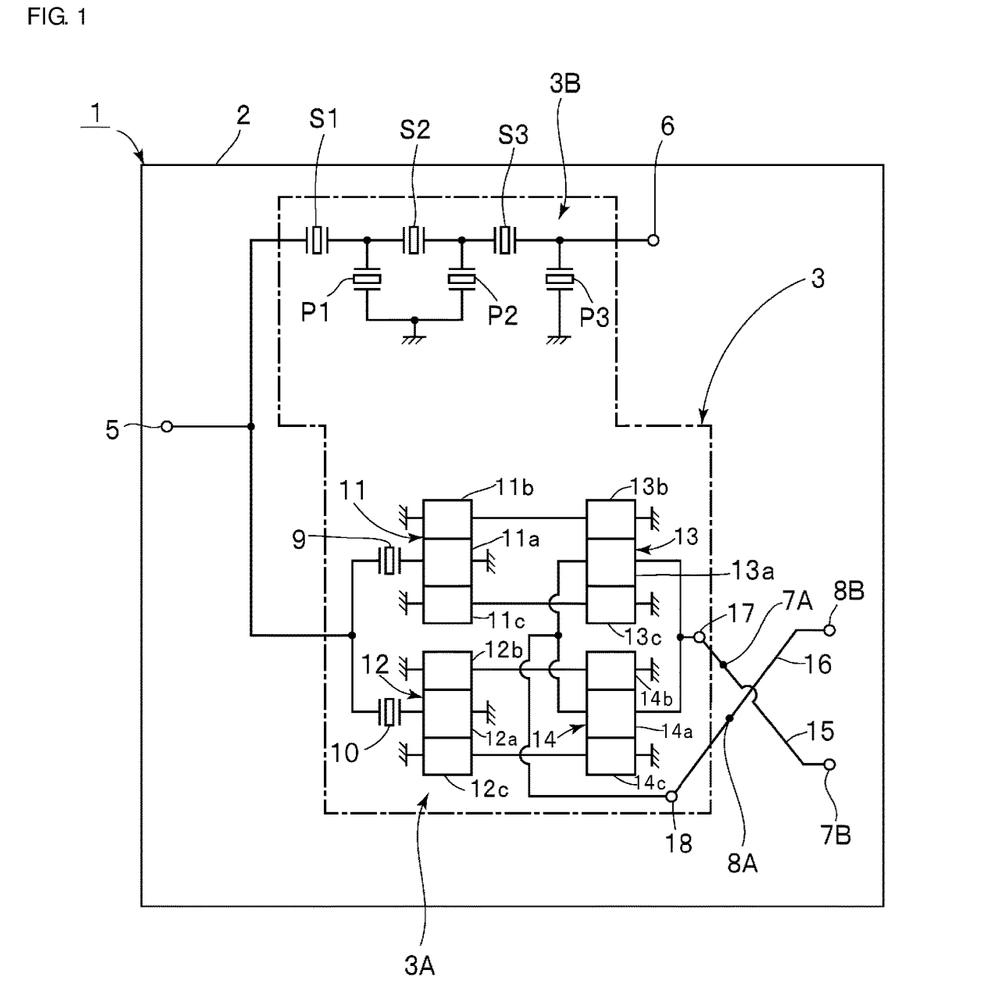
FIG. 1 is a circuit diagram of a filter device according to a first preferred embodiment of the present invention.
Figure 2A:
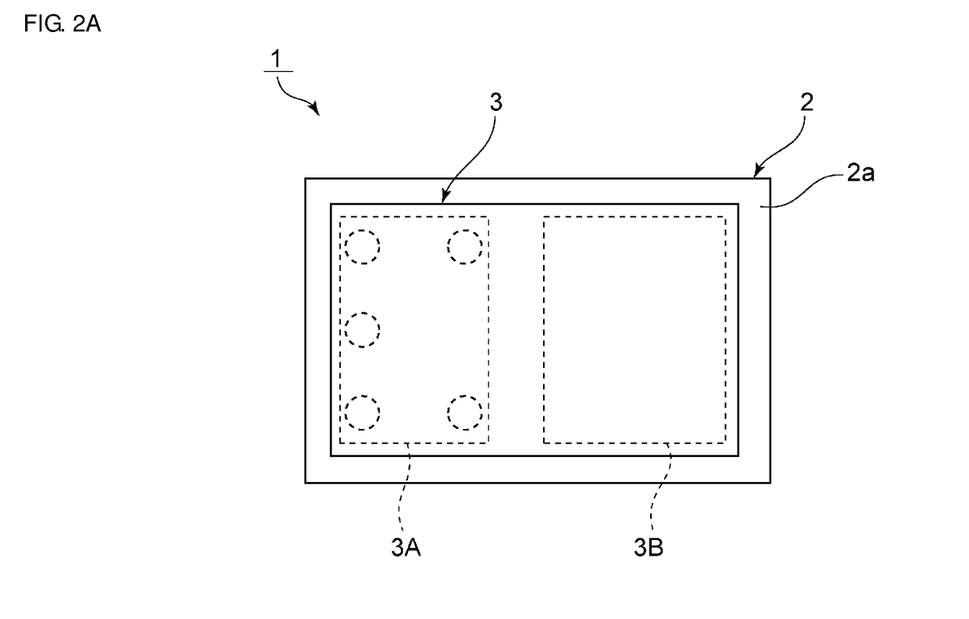
FIGS. 2A and 2B are a schematic plan view and a schematic front view of a filter device according to the first preferred embodiment of the present invention, respectively.
Figure 2B:
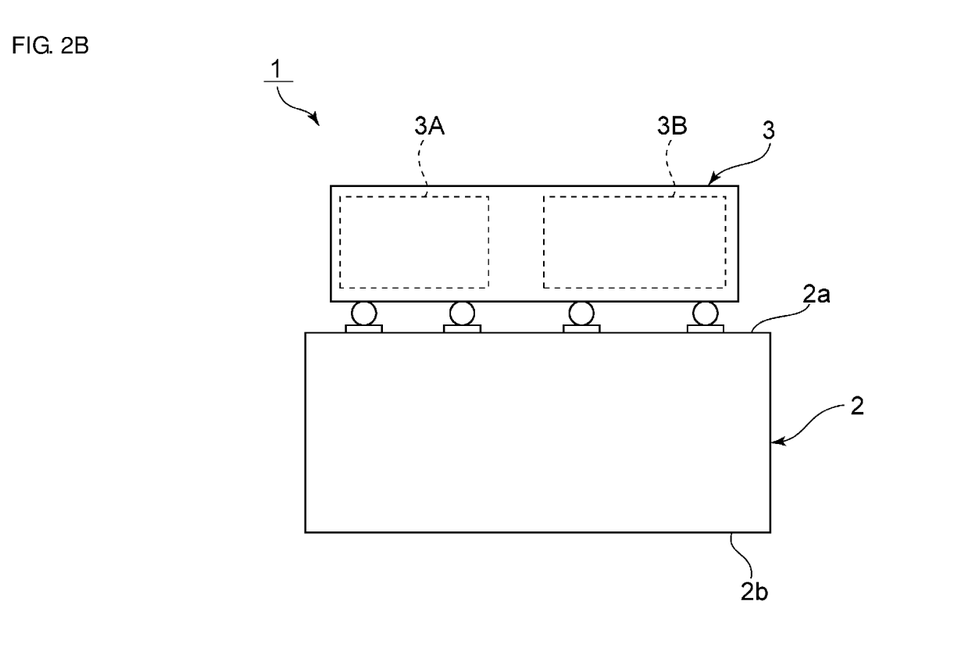

FIG. 1 is a circuit diagram of a filter device according to a first preferred embodiment of the present invention. FIGS. 2A and 2B are a schematic plan view and a schematic front view of the filter device according to the first preferred embodiment, respectively.

A filter device 1 according to the first preferred embodiment is preferably a duplexer, for example. The filter device 1 includes a multilayer substrate 2. As illustrated in FIGS. 2A and 2B, a filter chip 3 is mounted on the multilayer substrate 2. In the present preferred embodiment, a reception filter chip portion 3A and a transmission filter chip portion 3B are unified in the filter chip 3. Alternatively, the reception filter chip portion 3A and the transmission filter chip portion 3B may each be defined by an independent chip component.

Note that the reception filter chip portion 3A is preferably a reception filter that defines and functions as a first band-pass filter in the present preferred embodiment. Furthermore, the transmission filter chip portion 3B is preferably a transmission filter that defines and functions as a second bandpass filter.

FIG. 1 illustrates a circuit configuration inside the filter chip 3, which is a section surrounded by the dashed-dotted line. Inside the filter chip 3 surrounded by the dashed-dotted line, the reception filter chip portion 3A and the transmission filter chip portion 3B are provided.

In the reception filter chip portion 3A, first and second longitudinally coupled resonator surface acoustic wave filters 11 and 12 are connected to a common terminal 5 with one-port surface acoustic wave resonators 9 and 10 respectively interposed therebetween. Although schematically illustrated in FIG. 1, the first and second longitudinally coupled resonator surface acoustic wave filters 11 and 12 are preferably a three interdigital transducer (IDT) longitudinally coupled resonator surface acoustic wave filter, for example. In other words, the first longitudinally coupled resonator surface acoustic wave filter 11 includes a first IDT 11a provided at a center, and a second IDT 11b and a third IDT 11c provided at both sides of the first IDT 11a in a propagation direction of a surface acoustic wave. Similarly, the second longitudinally coupled resonator surface acoustic wave filter 12 includes a first IDT 12a, a second IDT 12b, and a third IDT 12c.

One end portion of the first IDT 11a of the first longitudinally coupled resonator surface acoustic wave filter 11 and one end portion of the first IDT 12a of the second longitudinally coupled resonator surface acoustic wave filter 12 are connected in common to the common terminal 5 with the one-port surface acoustic wave resonators 9 and 10 interposed therebetween, respectively. The other end portions of the first IDT 11a and the first IDT 12a are connected to a ground potential.

End portions of the second IDT 11b and the third IDT 11c of the first longitudinally coupled resonator surface acoustic wave filter 11 are each connected to the ground potential, and the other end portions of the second IDT 11b and the third IDT 11c are respectively connected to end portions of a second IDT 13b and a third IDT 13c of a third three-IDT longitudinally coupled resonator surface acoustic wave filter 13. The other end portions of the second IDT 13b and the third IDT 13c are connected to the ground potential.

Similarly, the second longitudinally coupled resonator elastic wave filter 12 is connected to and followed by a fourth three-IDT longitudinally coupled resonator surface acoustic wave filter 14. In other words, end portions of the second IDT 12b and the third IDT 12c are each connected to the ground potential, and the other end portions of the second IDT 12b and the third IDT 12c are electrically connected to end portions of a second IDT 14b and a third IDT 14c, respectively. The other end portions of the second IDT 14b and the third IDT 14c are connected to the ground potential.

One end portion of a first IDT 13a and one end portion of a first IDT 14a are connected in common to a first balanced terminal 17. The other end portion of the first IDT 13a and the other end portion of the first IDT 14a are also connected in common to a second balanced terminal 18.

Inside the multilayer substrate 2, a first balance wiring 15 and a second balance wiring 16 are provided.

The first balanced terminal 17 is electrically connected to a first balanced input pad 7A provided on the multilayer substrate 2. The second balanced terminal 18 is connected to a second balanced input pad 8A provided on the multilayer substrate 2.

As illustrated in FIG. 2B, the multilayer substrate 2 includes a first principal surface 2a and a second principal surface 2b facing the first principal surface 2a. As illustrated in FIGS. 2A and 2B, the filter chip 3 is mounted on the first principal surface 2a. The first balanced input pad 7A and the second balanced input pad 8A described above are provided on the first principal surface 2a. Inside the multilayer substrate 2, the first balance wiring 15 and the second balance wiring 16 are provided. Furthermore, the first balanced output pad 7B and the second balanced output pad 8B illustrated in FIG. 1 are provided on the second principal surface 2b of the multilayer substrate 2. The first balance wiring 15 electrically connects the first balanced input pad 7A and the first balanced output pad 7B. The second balance wiring 16 electrically connects the second balanced input pad 8A and the second balanced output pad 8B. The first balance wiring 15 crosses the second balance wiring 16 within the multilayer substrate 2 in a state in which the first balance wiring 15 and the second balance wiring 16 are electrically insulated from each other. This configuration is now described with reference to FIGS. 3A to 3C, FIGS. 4A to 4C, and FIG. 5.

Figure 3A:
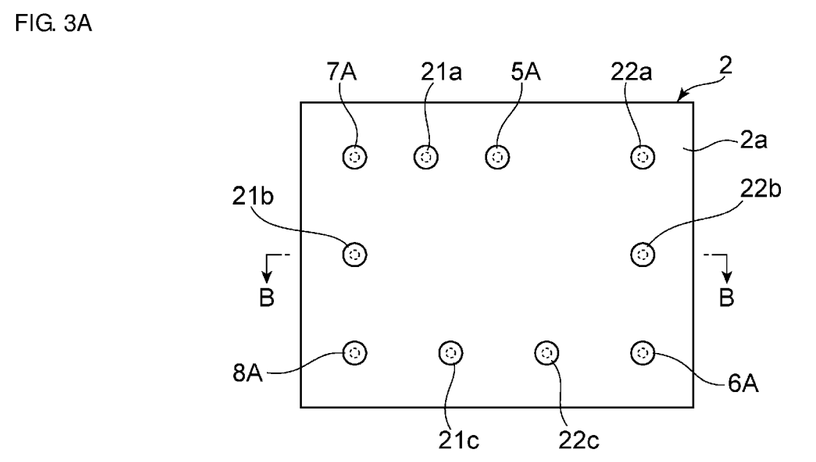
FIGS. 3A to 3C are plan views illustrating an electrode structure on a first principal surface, an electrode structure on a top surface of a fourth substrate layer, and an electrode structure on a top surface of a third substrate layer in a filter device according to the first preferred embodiment of the present invention, respectively.
Figure 3B:
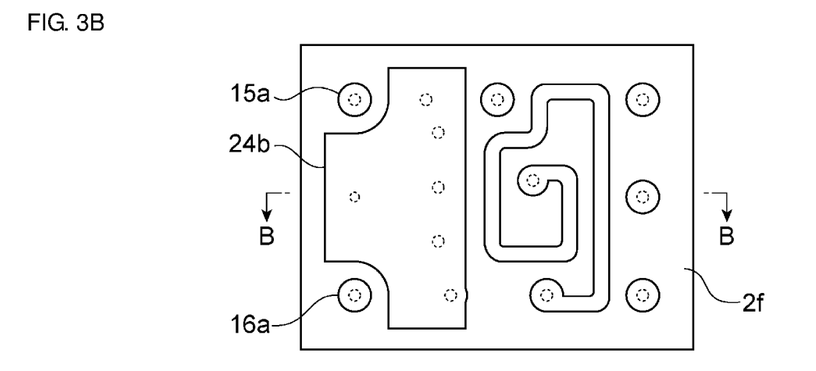
Figure 3C:
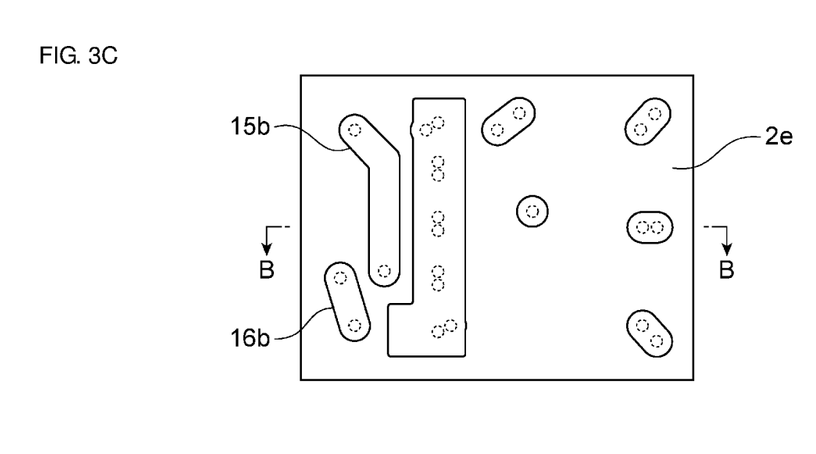
Figure 4A:
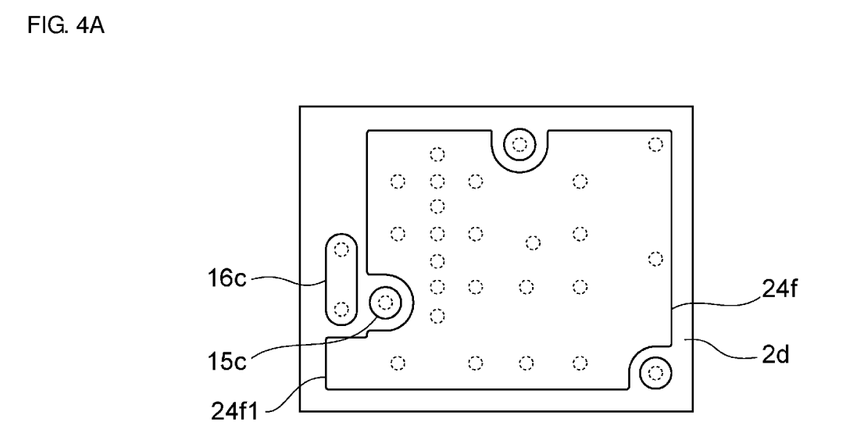
FIGS. 4A to 4C are plan views illustrating an electrode structure on a top surface of a second substrate layer, an electrode structure on a top surface of a first substrate layer, and an electrode structure on a second principal surface, respectively.
Figure 4B:
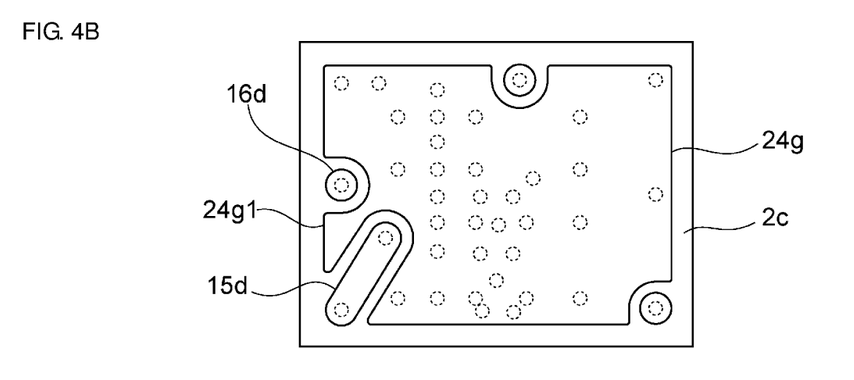
Figure 4C:
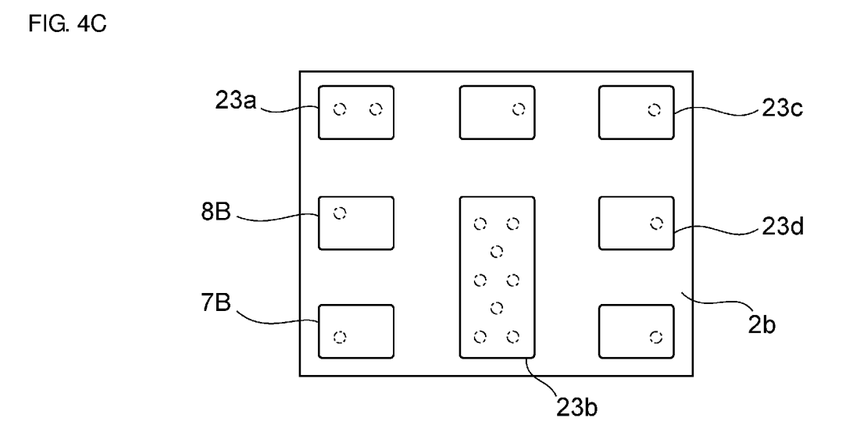
Figure 5:
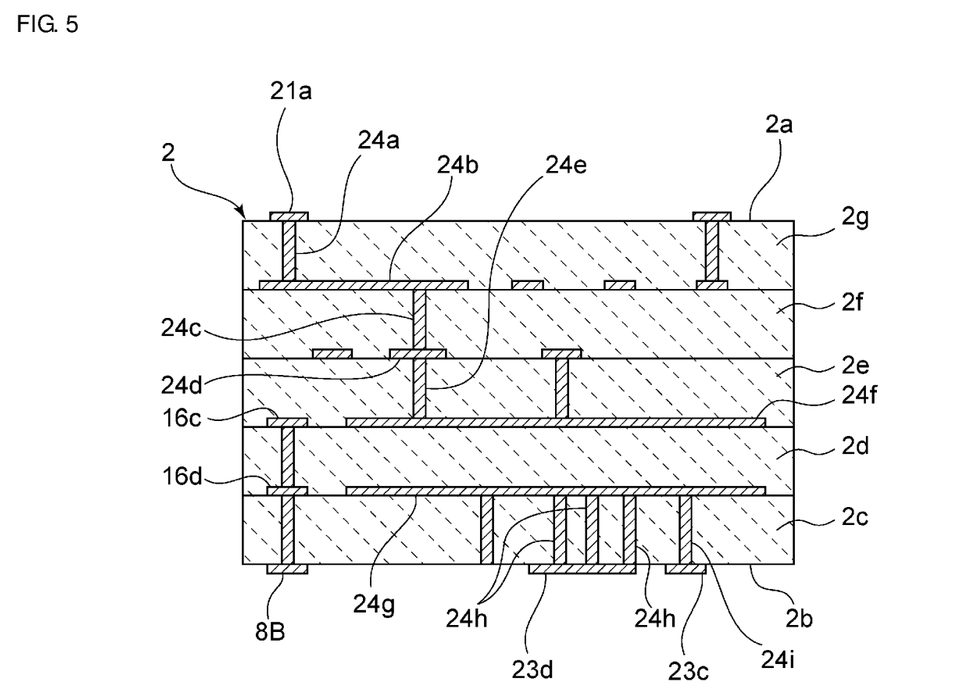
FIG. 5 is a frontal cross-sectional diagram of a multilayer substrate provided in a filter device according to the first preferred embodiment of the present invention, and is a cross-sectional diagram of a portion corresponding to a portion along lines B-B in FIGS. 3A to 3C.

The multilayer substrate 2 is preferably a multilayer body including five substrate layers, for example. FIG. 3A is a plan view illustrating an electrode structure on the first principal surface 2a of the multilayer substrate 2. FIG. 4C is a plan view illustrating a transparent view of an electrode structure on the second principal surface 2b of the multilayer substrate 2. Electrode structures illustrated in FIGS. 3B, 3C and FIGS. 4A and 4B are provided on interfaces of respective substrate layers arranged between the first principal surface 2a and the second principal surface 2b. FIG. 4B illustrates an electrode structure on a first substrate layer 2c, and FIG. 4A illustrates an electrode structure on a second substrate layer 2d. FIG. 3C illustrates an electrode structure on a third substrate layer 2e, and FIG. 3B illustrates an electrode structure on a fourth substrate layer 2f. FIG. 5 is a cross-sectional diagram of the multilayer substrate 2 at a portion corresponding to portions along lines B-B in FIGS. 3A to 3C. As illustrated in FIG. 5, the first to the fourth substrate layers 2c, 2d, 2e, and 2f are stacked in this order from the second principal surface 2b side toward the first principal surface 2a side.

On the first principal surface 2a of the multilayer substrate 2, an antenna pad 5A, the first balanced input pad 7A, the second balanced input pad 8A, and ground pads 21a to 21c to be connected to the ground potential are provided. Furthermore, at the portion at which the transmission filter chip portion 3B is mounted, a transmission pad 6A and ground pads 22a to 22c are provided.

In FIGS. 3A to 3C and FIGS. 4A to 4C, the portions defining the first balance wiring 15 include a conductive film 15a of FIG. 3B, a conductive film 15b of FIG. 3C, a conductive film 15c of FIG. 4A, a conductive film 15d of FIG. 4B, the first balanced output pad 7B, and via conductors connecting therebetween. Note that, in FIGS. 3A to 4B, the dashed line illustrates locations of the via conductors connected to bottom surfaces of the conductive films. In FIG. 4C, the dashed-dotted line illustrates locations of the via conductors connected to top surfaces of the conductive films, such as the balanced output pad 7B, for example.

The second balance wiring 16 connects the second balanced input pad 8A of FIG. 3A and the second balanced output pad 8B of FIG. 4C. Specifically, a conductive film 16a illustrated in FIG. 3B, a conductive film 16b illustrated in FIG. 3C, a conductive film 16c illustrated in FIG. 4A, a conductive film 16d illustrated in FIG. 4B, and via conductors connecting therebetween are included. Furthermore, the second balance wiring 16 includes a via conductor connecting the second balanced input pad 8A and the conductive film 16a and a via conductor connecting the conductive film 16d and the second balanced output terminal 8B.

FIGS. 3A to 4C clearly illustrate that, when the first balance wiring 15 and the second balance wiring 16 are viewed from the first principal surface 2a side, in plan view, the first balance wiring 15 and the second balance wiring 16 cross over each other in a state in which the first balance wiring 15 and the second balance wiring 16 are electrically insulated from each other.

On the other hand, in the multilayer substrate 2, the ground pads 21a to 21c and 22a to 22c are electrically connected to ground pads 23a to 23d provided on the second principal surface 2b with via conductors interposed therebetween, which are provided inside the multilayer substrate 2. For example, as illustrated in FIG. 5, the ground pad 21a is electrically connected to a ground conductor 24b provided on the fourth substrate layer 2f with a via conductor 24a interposed therebetween. As illustrated in FIG. 5, the ground conductor 24b is electrically connected to a ground conductor 24f with a via conductor 24c, a ground conductor 24d, and a via conductor 24e interposed therebetween. The ground conductor 24f is connected to a ground conductor 24g provided on the first substrate layer 2c with a via conductor interposed therebetween, which is not illustrated in FIG. 5. The ground conductor 24g is connected to the ground pad 23d with a plurality of via conductors 24h interposed therebetween. Furthermore, the ground conductor 24g is also electrically connected to the ground pad 23c with a via conductor 24i interposed therebetween.

In the present preferred embodiment, the first balance wiring 15 and the second balance wiring 16 cross each other within the multilayer substrate 2 such that the first balance wiring 15 and the second balance wiring 16 are electrically insulated from each other and, when the multilayer substrate 2 is viewed from the first principal surface 2a side, at a region in which the first balance wiring 15 overlaps the second balance wiring 16 in plan view, the ground conductor 24f defining a first ground pattern is interposed between a portion of the first balance wiring 15 and a portion of the second balance wiring 16 disposed in a different layer. In other words, as clearly illustrated in FIGS. 3A to 4C, when the portion in which the first balance wiring 15 and the second balance wiring 16 cross each other is viewed from the first principal surface 2a side, in plan view, the ground conductor 24f includes a flared portion 24f1. The flared portion 24f1 is provided between the conductive film 15d that is a portion of the first balance wiring and the conductive film 16b that is a portion of the second balance wiring. In other word, the flared portion 24f1 is provided between the conductive film 15d on the first substrate layer 2c and the conductive film 16b provided on the third substrate layer 2e, which is a different substrate layer.

Accordingly, in the filter device 1, it is possible to expand the out-of-band attenuation at the reception filter, which will be described below.

In addition, as illustrated in FIG. 4B, on the first substrate layer 2c, the ground conductor 24g includes a protruded portion 24g1 that defines a second ground pattern. The protruded portion 24g1 is extended between the conductive film 15d and the conductive film 16d. This reduces direct waves between the conductive film 15d and the conductive film 16d, thus making it possible to further expand the out-of-band attenuation.

Furthermore, as illustrated in FIGS. 4B, 4C, and FIG. 5, in the filter device 1, the ground conductor 24g having a large area is provided on the interface between the substrate layers that are closest to the second principal surface 2b, namely, on the top surface of the first substrate layer 2c. The ground conductor 24g preferably extends below the reception filter chip portion 3A and the transmission filter chip portion 3B. In other words, the ground conductor 24g is used in common by the reception filter and the transmission filter. In addition, the ground conductor 24g having a large area is connected to the ground pad 23d with the plurality of via conductors 24h interposed therebetween. Thus, in the filter device 1, it is possible to reinforce the ground potential, thus making it possible to expand the out-of-band attenuation.

Note that the height position inside the multilayer substrate 2 at which the first balance wiring 15 and the second balance wiring 16 cross each other is not limited to the position in the present preferred embodiment. Although the flared portion 24f1 is provided in the above, the first ground pattern extending between a portion of the first balance wiring and a portion of the second balance wiring may be similarly provided in a different substrate layer.

Furthermore, the second ground pattern is not limited to the protruded portion 24g1 of the ground conductor 24g. The second ground pattern having any appropriate shape may be provided between a portion of the first balance wiring and a portion of the second balance wiring that are placed next to each other at the same height position. Furthermore, a plurality of the second ground patterns may alternatively be provided.

Furthermore, the ground conductor having a large area may alternatively be provided on the top surface of the second substrate layer 2d or on any other location closer to the first principal surface 2a. Most preferably, as in the present preferred embodiment, the ground conductor 24g having a large area is provided on the top surface of the first substrate layer 2c. More preferably, this ground conductor 24g is connected to the ground pad 23d by the plurality of via conductors 24h as described above.

Returning to FIG. 1, other elements of the filter device 1 are now described.

The transmission filter is connected to the common terminal 5. The transmission filter chip portion 3B is preferably a surface acoustic wave filter having a ladder circuit configuration including three series arm resonators S1 to S3 and three parallel arm resonators P1 to P3, for example.

The series arm resonators S1 to S3 and the parallel arm resonators P1 to P3 are each preferably defined by a one-port surface acoustic wave resonator.

The transmission filter chip portion 3B is electrically connected to a transmission terminal 6. A transmitting signal is input from the transmission terminal 6. The transmitting signal is output to the common terminal 5 with the transmission filter chip portion 3B interposed therebetween.

Preferably, the filter device 1 of the present preferred embodiment may be used as a duplexer for BAND 1, and its transmission frequency band is from about 1920 MHz to about 1980 MHz and its reception frequency band is from about 2110 MHz to about 2170 MHz, for example.

In the filter device 1, the multilayer substrate 2 includes a plurality of substrate layers 2c to 2g made of insulating material. The insulating material is not limited to any particular material, and any appropriate insulating ceramic, such as alumina and other insulating ceramic or a synthetic resin and other suitable material may be used.

The first and second balanced input pads, the first and second balanced output pads, the conductive films, the ground conductors, and the via conductors, which are described above, may be made of any appropriate metal or alloy.

Figure 6:
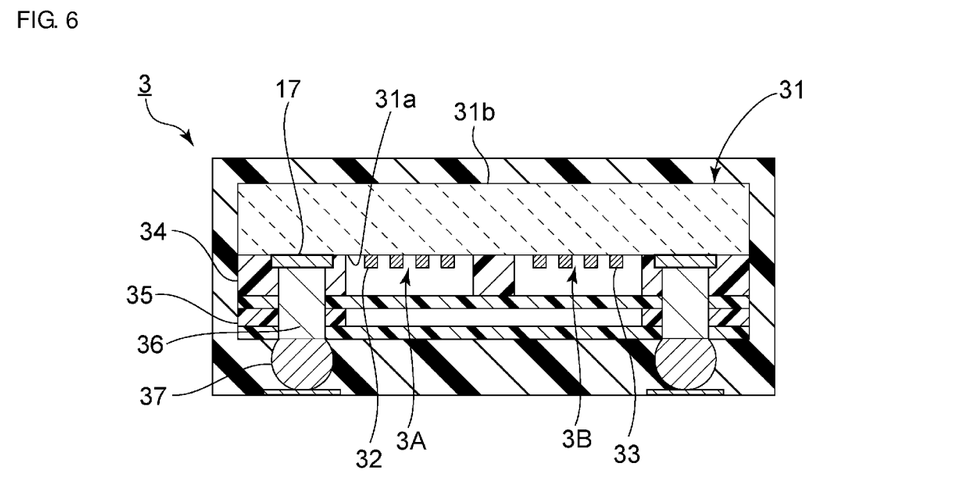
FIG. 6 is a frontal cross-sectional diagram illustrating an example of a specific structure of a filter chip provided in the first preferred embodiment of the present invention.

FIG. 6 is a frontal cross-sectional diagram illustrating an example of a specific structure of the filter chip 3. The filter chip 3 includes a piezoelectric substrate 31. The piezoelectric substrate 31 includes a first principal surface 31a and a second principal surface 31b facing the first principal surface 31a. Functional electrodes 32 including the IDT electrodes are provided on the first principal surface 31a. The functional electrodes 32 face a cavity space, and define the reception filter chip portion 3A. In the transmission filter chip portion 3B, functional electrodes 33 facing another cavity space are provided.

A support layer 34 with an opening is provided and defines the cavity spaces to which the functional electrodes 32 and 33 face. A cover 35 closes the opening of the support layer 34.

An electrode land corresponding to the first balanced terminal 17 is provided on the first principal surface 31a of the piezoelectric substrate 31. The second balanced terminal 18 illustrated in FIG. 1 is not illustrated in FIG. 6.

The first balanced terminal 17 is joined to a bump 37 with an under-bump metal layer 36 interposed therebetween, which passes through the support layer 34 and the cover 35. This bump 37 is joined to the first balanced input pad 7A. Similarly, the second balanced terminal is connected to the second balanced input pad 8A provided on the first principal surface of the multilayer substrate 2 with an under-bump metal layer and a bump interposed therebetween.

Preferably, the first balance wiring 15 and the second balance wiring 16 are structured such that the wiring length from the first balanced terminal 17 on the first principal surface 31a of the piezoelectric substrate 31 to the first balanced output pad 7B provided on the second principal surface 2b of the multilayer substrate 2 is equal or substantially equal to the wiring length from the second balanced terminal to the second balanced output pad. In this case, isolation is further improved.

Note that the filter chip 3 is not limited to a WLP (wafer level packaging) structure illustrated in FIG. 6, and may alternatively be a CSP (chip scale packaging) structure. Furthermore, although the reception filter chip portion 3A and the transmission filter chip portion 3B are unified in the present preferred embodiment, they may alternatively be provided as individual filter chips.

Furthermore, the number of substrate layers stacked on the multilayer substrate 2 is not limited to five layers, and may be any number.

In the present preferred embodiments, in the multilayer substrate 2, the ground conductors 24f and 24g defining the ground patterns preferably are used in common at the transmission side and the reception side. However, the ground conductors 24f and 24g may not necessarily be used in common.

Next, a specific experimental example is described.

A filter chip 3 of the present preferred embodiment having the following specifications was prepared.

(1) Configuration of Multilayer Substrate

Substrate material: Glass epoxy. Thickness of multilayer substrate 2=about 0.3 mm. Number of substrate layers=5.

(2) Configuration of Reception Filter Chip Part 3A

Substrate material: $LiTaO_3$. Thickness of piezoelectric substrate=about 0.2 mm.

(3) Configuration of Transmission Filter Chip Part 3B

Substrate material: $LiTaO_3$. Thickness of piezoelectric substrate=about 0.2 mm.

For comparison, a multilayer substrate 2 was similarly configured except not including the flared portion 24f1 and the protruded portion 24g1, and on the multilayer substrate 2, a filter chip including a transmission filter chip portion and a reception filter chip portion that are similar to those in the present preferred embodiment was mounted. In this manner, a filter device of the comparative example was prepared.

Figure 7:
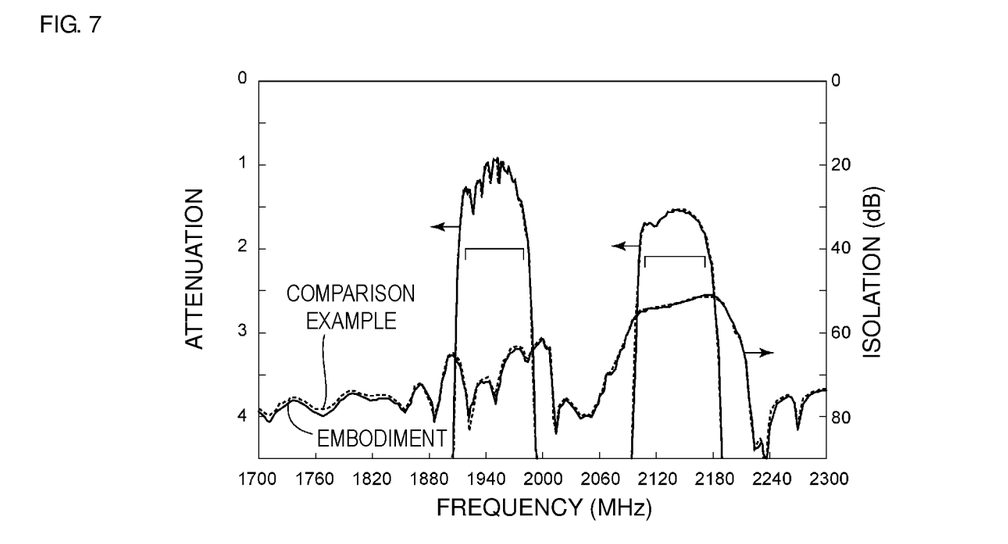
FIG. 7 is a diagram illustrating attenuation-frequency characteristics and isolation characteristics of filter devices according to a preferred embodiment of the present invention and a comparison example.
Figure 8:
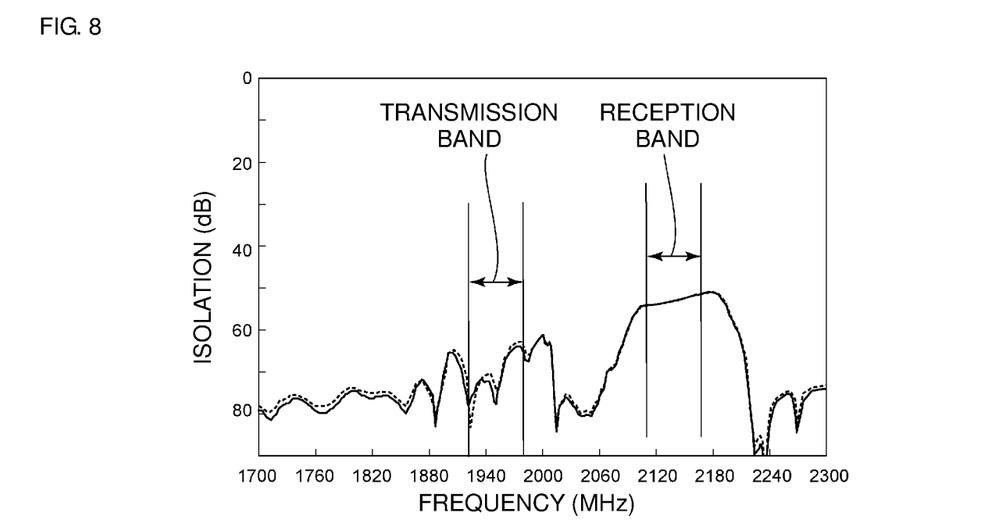
FIG. 8 is a diagram extracting only the isolation characteristics illustrated in FIG. 7.
Figure 9:
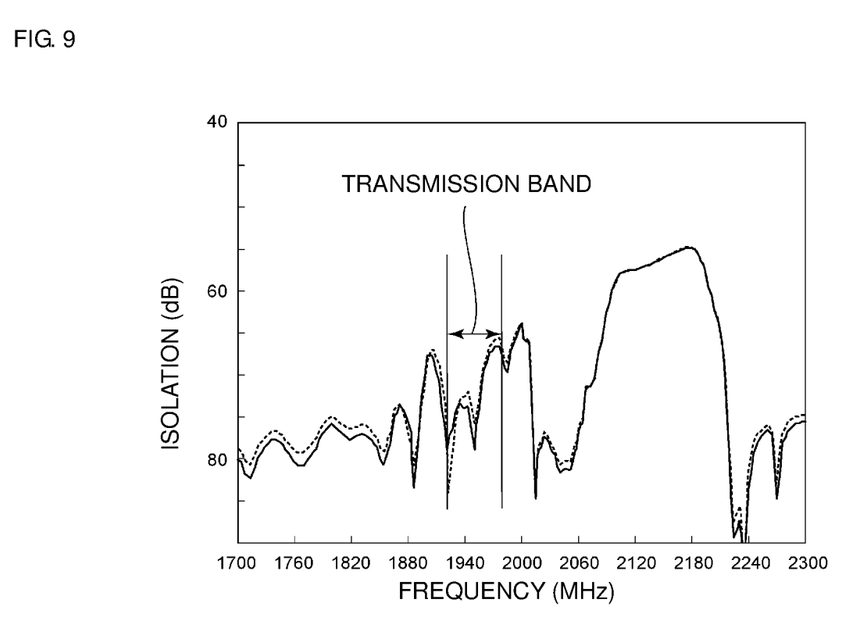
FIG. 9 is a diagram in which an isolation scale factor in a vertical axis of FIG. 8 is expanded.

FIG. 7 is a diagram illustrating attenuation-frequency characteristics of filter devices of the present preferred embodiment and the comparative example. In FIG. 7, a transmission band representing the transmission frequency band is from about 1920 MHz to about 1980 MHz, and a reception band representing the reception frequency band is from about 2110 MHz to about 2170 MHz. The solid line represents a result of the present preferred embodiment, and the dashed line represents a result of the comparative example. FIG. 7 also illustrates isolation characteristics. The solid line represents a result of the present preferred embodiment, and the dashed line represents a result of the comparative example. Only the isolation characteristics illustrated in FIG. 7 are extracted and illustrated in FIG. 8, and an enlarged view in which the isolation scale factor in the vertical axis of FIG. 8 is expanded is illustrated in FIG. 9.

As clearly illustrated in FIG. 7, the out-of-band attenuation of the reception filter increased in the present preferred embodiment, particularly at the transmission band, as compared to the comparative example. Accordingly, as illustrated in FIG. 7 to FIG. 9, it was possible to effectively improve the isolation at the transmission band. In other words, it was discovered and confirmed that the present preferred embodiment improved the isolation considerably at the worst isolation portion of the transmission band as compared to the comparative example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
a multilayer substrate including a plurality of substrate layers, a first principal surface, and a second principal surface facing the first principal surface;
a first bandpass filter chip mounted on the first principal surface of the multilayer substrate and including a first balanced output terminal and a second balanced output terminal, the first bandpass filter chip defining a first balanced bandpass filter;
a first balanced input pad and a second balanced input pad provided on the first principal surface of the multilayer substrate and connected to the first balanced output terminal and the second balanced output terminal of the first bandpass filter chip, respectively;
a first balanced output pad and a second balanced output pad provided on the second principal surface of the multilayer substrate
a first balance wiring provided inside the multilayer substrate and electrically connecting the first balanced input pad and the first balanced output pad; and
a second balance wiring provided inside the multilayer substrate and electrically connecting the second balanced input pad and the second balanced output pad; wherein
the first balance wiring and the second balance wiring cross each other within the multilayer substrate such that the first balance wiring and the second balance wiring are electrically insulated from each other; and
when the multilayer substrate is viewed from a first principal surface side, in plan view, a first ground pattern is provided at a region in which the first balance wiring overlaps the second balance wiring, the first ground pattern being interposed between a portion of the first balance wiring and a portion of the second balance wiring disposed at a different substrate layer of the plurality of substrate layers.

2. The filter device according to claim 1, wherein a second ground pattern is disposed between a portion of the first balance wiring and a portion of the second balance wiring, the portion of the first balance wiring and the portion of the second balance wiring being disposed next to each other within a same plane of the multilayer substrate.

3. The filter device according to claim 2, wherein, of the plurality of substrate layers of the multilayer substrate, the second ground pattern is provided on a substrate layer closest to the second principal surface.

4. The filter device according to claim 3, further comprising:
a plurality of via conductors; wherein
a plurality of ground terminals are provided on the second principal surface of the multilayer substrate; and
the plurality of via conductors connect the plurality of ground terminals and the second ground pattern.

5. The filter device according to claim 1, wherein, when the multilayer substrate is viewed from the first principal surface, in plan view, a spatial relationship between the first balanced input pad and the second balanced input pad is opposite to a spatial relationship between the first balanced output pad and the second balanced output pad.

6. The filter device according to claim 1, further comprising a second bandpass filter chip mounted on the first principal surface of the multilayer substrate and defining a second bandpass filter to define a duplexer.

7. The filter device according to claim 6, wherein the second bandpass filter chip is unified with the first bandpass filter chip.

8. The filter device according to claim 7, wherein at least one ground pattern is used in common in the first bandpass filter chip and the second bandpass filter chip.

9. The filter device according to claim 6, wherein the first bandpass filter is a reception filter, and the second bandpass filter chip is a transmission filter.

10. The filter device according to claim 9, wherein
the reception filter has a reception frequency band of about 2110 MHz to about 2170 MHz; and
the transmission filter has a transmission frequency band of about 1920 MHz to about 1980 MHz.

11. The filter device according to claim 6, wherein the second bandpass filter is a surface acoustic wave filter.

12. The filter device according to claim 11, wherein the surface acoustic wave filter has a ladder circuit configuration including three series arm resonators and three parallel arm resonators.

13. The filter device according to claim 12, wherein each of the series arm resonators and the parallel arm resonators is a one-port surface acoustic wave resonator.

14. The filter device according to claim 1, wherein the first bandpass filter includes first and second longitudinally coupled resonator surface acoustic wave filters connected to a common terminal with first and second one-port surface acoustic wave resonators respectively interposed therebetween.

15. The filter device according to claim 14, wherein each of the first and second longitudinally coupled resonator surface acoustic wave filters is a three interdigital transducer longitudinally coupled resonator surface acoustic wave filter.

16. The filter device according to claim 1, wherein the multilayer substrate includes five substrate layers.

17. The filter device according to claim 1, wherein the plurality of substrate layers are made of an insulating material.

18. The filter device according to claim 17, wherein the insulating material is alumina.

19. The filter device according to claim 17, wherein the insulating material is synthetic resin.

* * * * *